US009165928B2

(12) United States Patent
Xie et al.

(10) Patent No.: US 9,165,928 B2
(45) Date of Patent: Oct. 20, 2015

(54) METHODS OF FORMING GATE STRUCTURES FOR CMOS BASED INTEGRATED CIRCUIT PRODUCTS AND THE RESULTING DEVICES

(71) Applicant: GLOBALFOUNDRIES Inc., Grand Cayman (KY)

(72) Inventors: Ruilong Xie, Niskayuna, NY (US); Kisik Choi, Hopewell Junction, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 93 days.

(21) Appl. No.: 13/918,569

(22) Filed: Jun. 14, 2013

(65) Prior Publication Data

US 2014/0367788 A1    Dec. 18, 2014

(51) Int. Cl.
*H01L 21/8238* (2006.01)
*H01L 27/092* (2006.01)

(52) U.S. Cl.
CPC ...... *H01L 27/092* (2013.01); *H01L 21/823835* (2013.01); *H01L 21/823842* (2013.01); *H01L 21/823828* (2013.01)

(58) Field of Classification Search
CPC .......... H01L 29/66545; H01L 21/823842; H01L 21/823864; H01L 21/8238; H01L 21/82385; H01L 21/823828; H01L 29/66621; H01L 21/823468; H01L 29/4234
See application file for complete search history.

(56) References Cited

U.S. PATENT DOCUMENTS

| 2010/0035400 | A1* | 2/2010 | Zhu et al. | 438/300 |
| 2012/0068261 | A1* | 3/2012 | Kwon et al. | 257/331 |
| 2013/0078792 | A1* | 3/2013 | Huang et al. | 438/591 |

* cited by examiner

*Primary Examiner* — Minh-Loan Tran
*Assistant Examiner* — Leslie Pilar Cruz
(74) *Attorney, Agent, or Firm* — Amerson Law Firm, PLLC

(57) ABSTRACT

One illustrative method disclosed herein includes forming gate insulation layers and a first metal layer for NMOS and PMOS devices from the same material, selectively forming a first metal layer only for the PMOS device, and forming different shaped metal silicide regions within the NMOS and PMOS gate cavities. A novel integrated circuit product disclosed herein includes an NMOS transistor with an NMOS gate insulation layer, an NMOS metal silicide having a generally rectangular cross-sectional configuration and an NMOS metal layer positioned on the NMOS metal silicide region. The product also includes a PMOS transistor with the same gate insulation material, a first PMOS metal and a PMOS metal silicide region, wherein the NMOS and PMOS metal silicide regions are comprised of the same metal silicide.

28 Claims, 12 Drawing Sheets

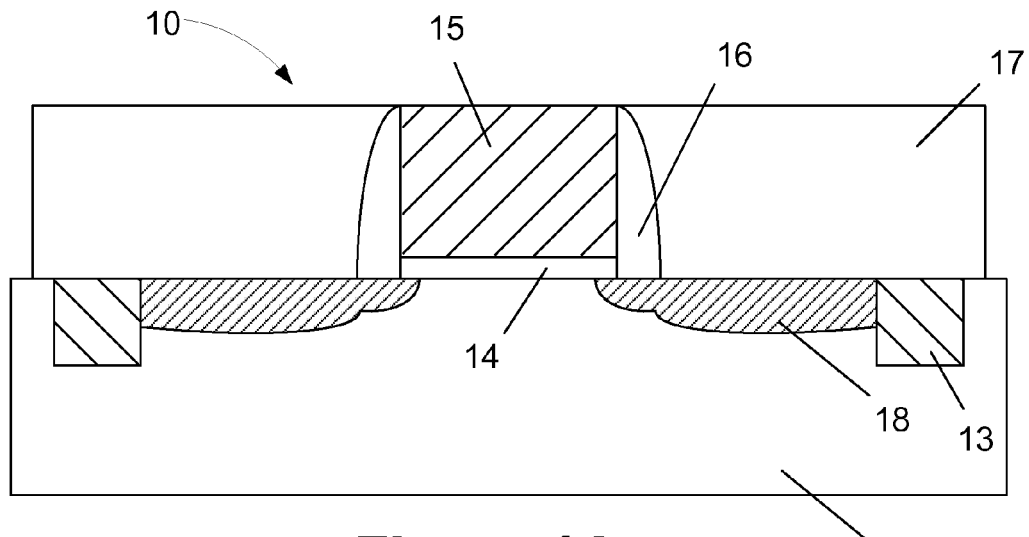
(Prior Art) Figure 1A
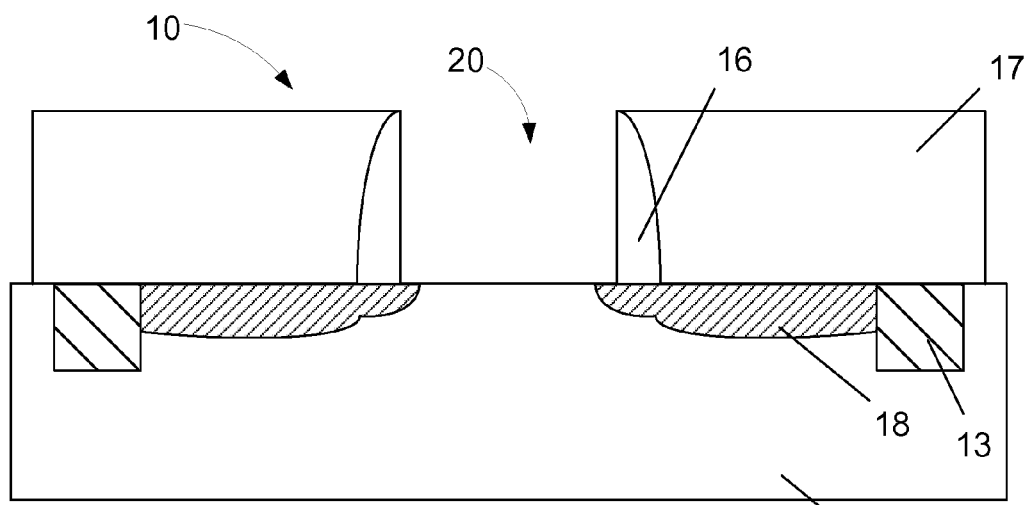
(Prior Art) Figure 1B

METHODS OF FORMING GATE STRUCTURES FOR CMOS BASED INTEGRATED CIRCUIT PRODUCTS AND THE RESULTING DEVICES

BACKGROUND OF THE INVENTION

1. Field of the Invention

Generally, the present disclosure relates to the manufacture of semiconductor devices, and, more specifically, to various novel methods of forming gate structures for CMOS-based integrated circuit products and various novel CMOS-based integrated circuit products.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. The transistors are typically either NMOS (NFET) or PMOS (PFET) type devices wherein the "N" and "P" designations are based upon the type of dopants used to create the source/drain regions of the devices. So-called CMOS (Complementary Metal Oxide Semiconductor) technology or products refers to integrated circuit products that are manufactured using both NMOS and PMOS transistor devices.

Field effect transistors, whether an NMOS or a PMOS device, typically include a source region, a drain region, a channel region that is positioned between the source region and the drain region, and a gate electrode positioned above the channel region. Current flow through the FET is controlled by controlling the voltage applied to the gate electrode. For an NMOS device, if there is no voltage (or a logically low voltage) applied to the gate electrode, then there is no current flow through the device (ignoring undesirable leakage currents, which are relatively small). However, when an appropriate positive voltage (or logically high voltage) is applied to the gate electrode, the channel region of the NMOS device becomes conductive, and electrical current is permitted to flow between the source region and the drain region through the conductive channel region. For a PMOS device, the control voltages are reversed. Field effect transistors may come in a variety of different physical shapes, e.g., so-called planar FET devices or so-called 3-D or FinFET devices.

For many decades, planar FET devices were the dominant choice for making integrated circuit products due to the relatively easier manufacturing methods that are used to form such planar devices as compared to the manufacturing methods involved in forming 3-D devices. To improve the operating speed of planar FETs, and to increase the density of planar FETs on an integrated circuit device, device designers have greatly reduced the physical size of planar FETs over the years. More specifically, the channel length of planar FETs has been significantly decreased, which has resulted in improving the switching speed of planar FETs. However, decreasing the channel length of a planar FET also decreases the distance between the source region and the drain region. In some cases, this decrease in the separation between the source and the drain regions makes it difficult to efficiently inhibit the electrical potential of the source region and the channel from being adversely affected by the electrical potential of the drain region. This is sometimes referred to as so-called short channel effects, wherein the characteristic of the planar FET as an active switch is degraded.

As noted above, in contrast to a planar FET, a so-called 3-D or FinFET device has a three-dimensional (3D) structure. More specifically, in a FinFET, a generally vertically positioned fin-shaped active area is formed in a semiconductor substrate and a gate structure (gate insulation layer plus the gate electrode) is positioned around both of the sides and the upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin, become a conductive channel region, thereby allowing current to flow. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements have been comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar device or 3-D devices. FIGS. 1A-1D simplistically depicts one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm and the bulk metal layer 30E.

As the gate length of transistor devices has decreased, the physical size of the gate cavity 20 has also decreased. Thus, it is becoming physically difficult to fit all of the layers of material needed for the replacement gate structure 30, particularly for NMOS devices, due to the greater number of layers of material that are typically used to form the gate structures for the NMOS devices, within the reduced-size gate cavity. For example, as gate lengths continue to decrease, voids or seams may be formed as the various layers of material are deposited into the gate cavity 20. Such voids or seams may result in devices that perform at levels less than anticipated or, in some cases, the formation of devices that are simply not acceptable and have to be discarded.

The present disclosure is directed to various methods of forming gate structures for CMOS-based integrated circuit products and various CMOS-based integrated circuit products that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming gate structures for CMOS-based integrated circuit products and various novel CMOS-based integrated circuit products. One illustrative method disclosed herein includes forming replacement gate structures for an NMOS transistor and a PMOS transistor by performing at least one etching process to remove the sacrificial gate structures for the NMOS and PMOS transistors to thereby define NMOS and PMOS gate cavities, respectively, depositing a gate insulation layer in the NMOS and PMOS gate cavities, performing at least one first process operation so as to form a first metal layer on the gate insulation layer in both the NMOS gate cavity and the PMOS gate cavity and thereafter remove the first metal layer within the NMOS gate cavity while leaving a remaining portion of the first metal layer positioned on the gate insulation layer in the PMOS gate cavity, performing at least one second process operation to form first and second metal silicide regions within the NMOS gate cavity and the PMOS gate cavity, respectively, wherein the first metal silicide region is positioned above the gate insulation layer in the NMOS gate cavity and the second metal silicide region is positioned above at least the remaining portion of the first metal layer within the PMOS gate cavity, and forming first and second gate cap layers within the NMOS and PMOS gate cavities, respectively, above the first and second metal silicide regions, respectively.

Another illustrative method disclosed herein includes forming replacement gate structures for an NMOS transistor and a PMOS transistor by performing at least one etching process to remove the sacrificial gate structures for the NMOS and PMOS transistors to thereby define NMOS and PMOS gate cavities, respectively, depositing a gate insulation layer in the NMOS and PMOS gate cavities, depositing a first metal layer on the gate insulation layers in the NMOS and PMOS gate cavities, performing at least one first process operation to selectively remove the first metal layer from within the NMOS gate cavity while leaving a remaining portion of the first metal layer positioned on the gate insulation layer in the PMOS gate cavity, performing at least one second process operation to form a first portion of a silicon-containing material within the NMOS cavity above the gate insulation layer and a second portion of the silicon-containing material within the PMOS cavity above the remaining portion of the first metal layer, forming a layer of tungsten on the first and second portions of the silicon-containing material and converting at least a portion of the first and second silicon-containing materials into first and second tungsten silicide regions while leaving a portion of the layer of tungsten above the first and second silicide regions, wherein the first tungsten silicide region is formed within the NMOS gate cavity above the gate insulation layer and the second tungsten silicide region is formed within the PMOS gate cavity above at least the remaining portion of the first metal layer.

One example of a novel integrated circuit product disclosed herein includes an NMOS transistor having a gate structure comprised of an NMOS gate insulation layer comprised of a high-k gate insulation material, an NMOS metal silicide region positioned above the NMOS gate insulation layer, wherein the NMOS metal silicide region has a generally rectangular cross-sectional configuration, and an NMOS metal layer positioned on the NMOS metal silicide region. The integrated circuit product further includes a PMOS transistor having a gate structure comprised of a PMOS gate insulation layer comprised of the high-k gate insulation material, a first PMOS metal layer positioned on the PMOS gate insulation layer, a PMOS metal silicide region positioned above the first PMOS metal layer, wherein the PMOS metal silicide region has a generally T-shaped cross-sectional configuration and wherein the PMOS metal silicide region and the NMOS metal silicide region are comprised of the same metal silicide, and a second PMOS metal layer positioned on the PMOS metal silicide region, wherein the NMOS metal layer and the second PMOS metal layer are comprised of the same material.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art method of forming a gate structure of the transistors using a so-called "replacement gate" technique.

Figure 1C:
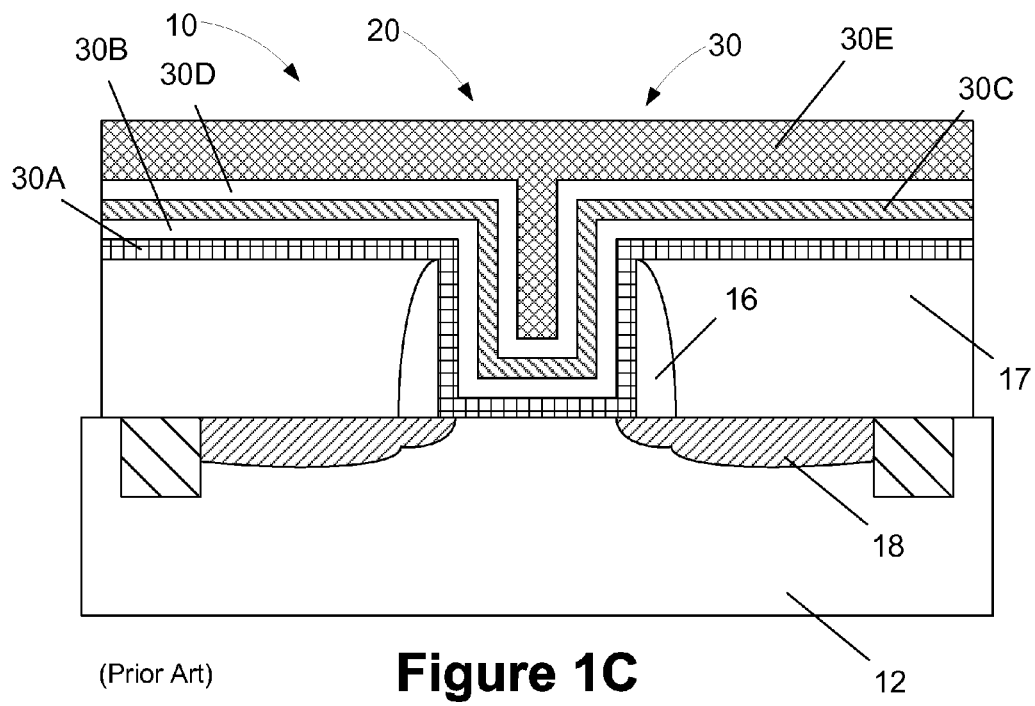
Figure 1D:
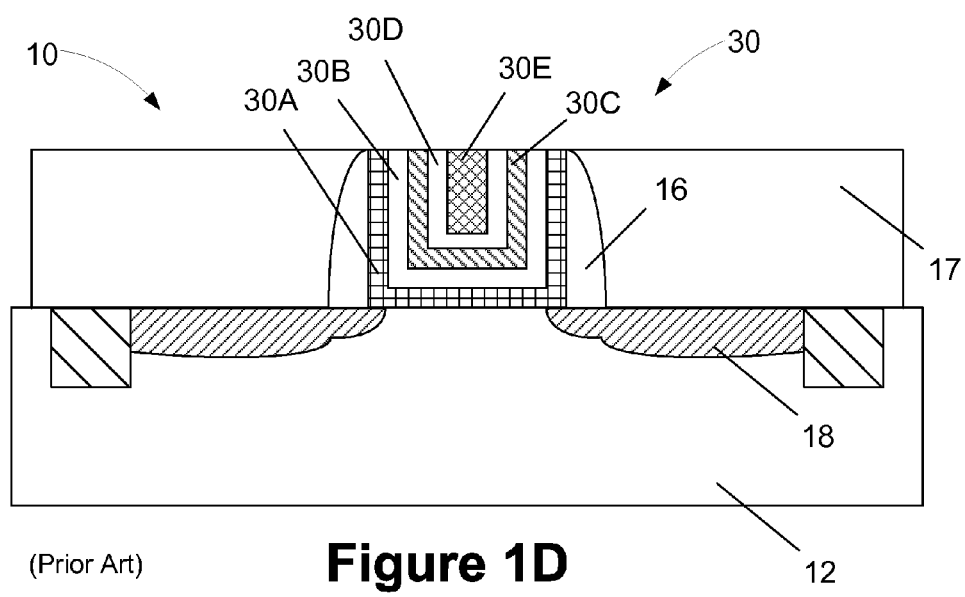

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming gate structures for CMOS-based integrated circuit products and various CMOS-based integrated circuit products. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using planar transistor devices, as well as so-called 3-D devices, such as FiNFETs, or a combination of such devices. For purposes of disclosure, reference will be made to an illustrative process flow wherein an integrated circuit product 100 is formed with a plurality of planar transistor devices using CMOS technology. However, the inventions disclosed herein should not be considered to be limited to such an illustrative example.

Figure 2A:
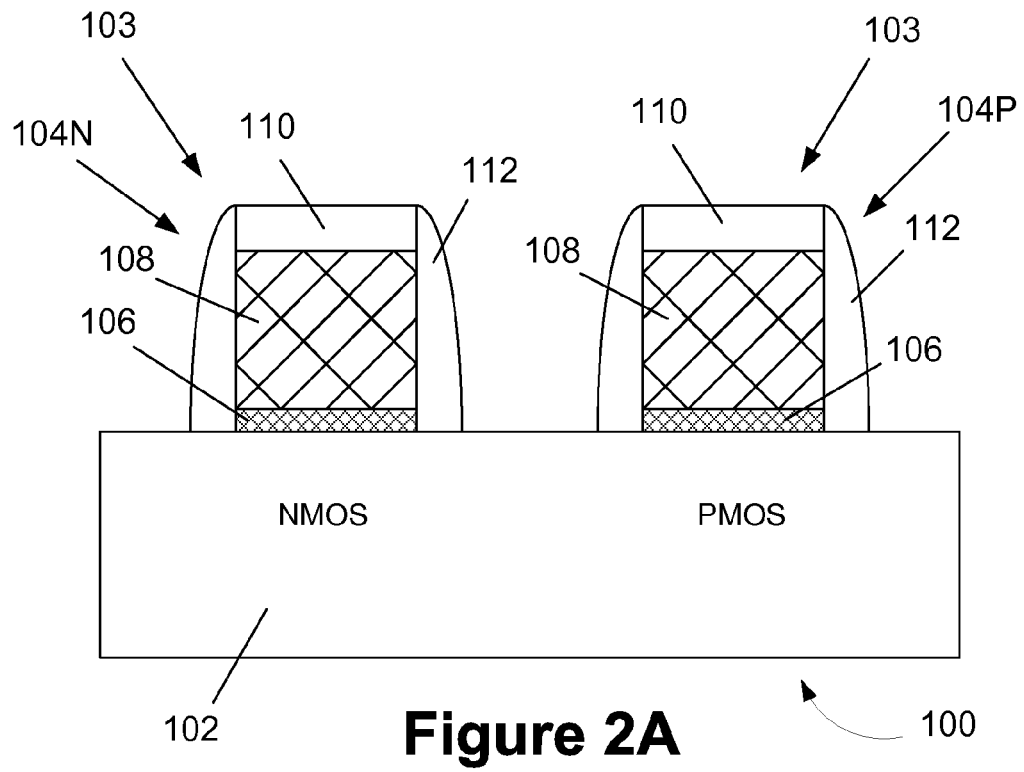
FIGS. 2A-2S depict various illustrative methods disclosed herein for forming gate structures for CMOS-based integrated circuit products and various novel CMOS-based integrated circuit products.

FIG. 2A is a simplified view of an illustrative integrated circuit product 100 at an early stage of manufacturing. Illustrative NMOS transistor 104N and PMOS transistor 104P will be formed in and above the semiconductor substrate 102. So as not to obscure the inventions disclosed herein, isolation regions that are formed in the substrate 102 to define active regions where the transistors 104N, 104P will be formed are not depicted in the attached drawings. Additionally, various doped regions, e.g., source/drain regions, halo implant regions, well regions and the like, are also not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

In the example disclosed herein, the transistors 104N, 104P will be formed using a replacement gate technique. Accordingly, FIG. 2A depicts the product 100 at a point in fabrication wherein sacrificial gate structures 103 have been formed above the substrate 102. As noted above, at this point in the replacement gate process flow, source/drain regions (not shown) would have already been formed in the substrate 102 and an anneal process would have been performed to activate the implanted dopant materials and repair any damage to the substrate 102 due to the various ion implantation processes that were performed. The sacrificial gate structures 103 include a sacrificial gate insulation layer 106 and a dummy or sacrificial gate electrode 108. Also depicted are illustrative sidewall spacers 112 and illustrative gate cap layers 110. The various components and structures of the product 100 may be formed using a variety of different materials and by performing a variety of known techniques. For example, the sacrificial gate insulation layer 106 may be comprised of silicon dioxide, the sacrificial gate electrode 108 may be comprised of polysilicon, and the sidewall spacers 112 and the gate cap layers 110 may be comprised of silicon nitride. The layers of material depicted in FIG. 2A, as well as the layers of materials described below, may be formed by any of a variety of different known techniques, e.g., a chemical vapor deposition (CVD) process, an atomic layer deposition (ALD) process, a thermal growth process, etc.

Figure 2B:
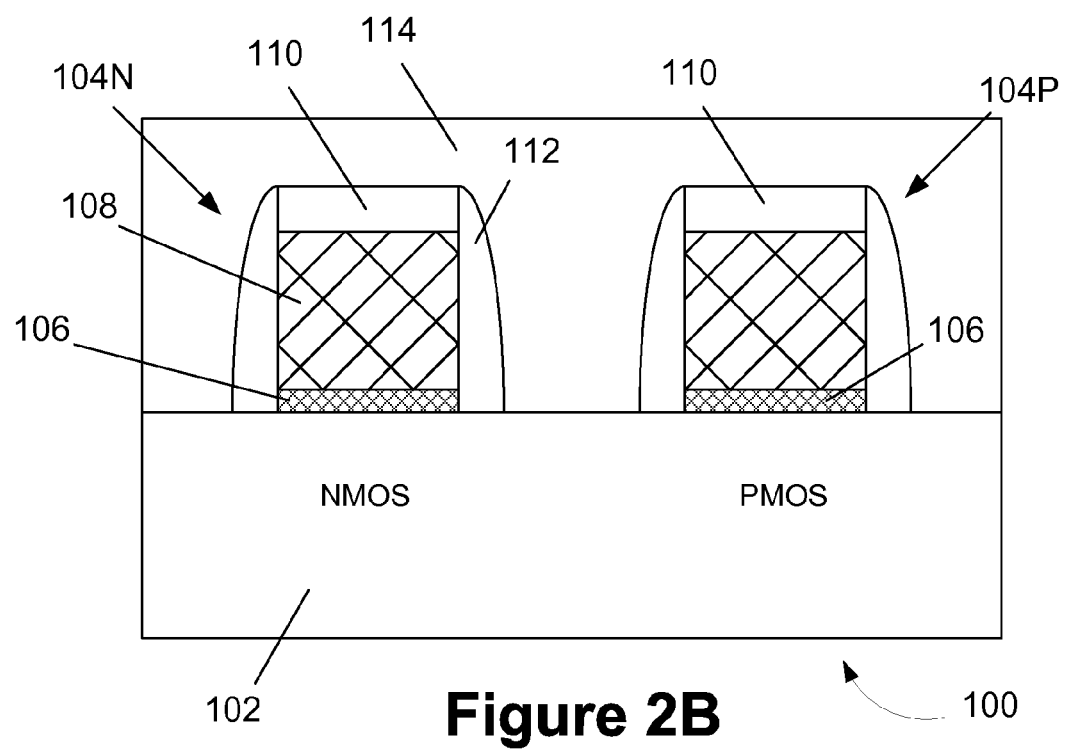

FIG. 2B depicts the product 100 after a layer of insulating material 114, e.g., silicon dioxide, a low-k material (k value less than about 3.3), etc., has been deposited above the product 100. In one embodiment, the layer of insulating material 114 may be a layer of silicon dioxide that is formed by performing a CVD process. The layer of insulating material 114 may be formed to any desired thickness.

Figure 2C:
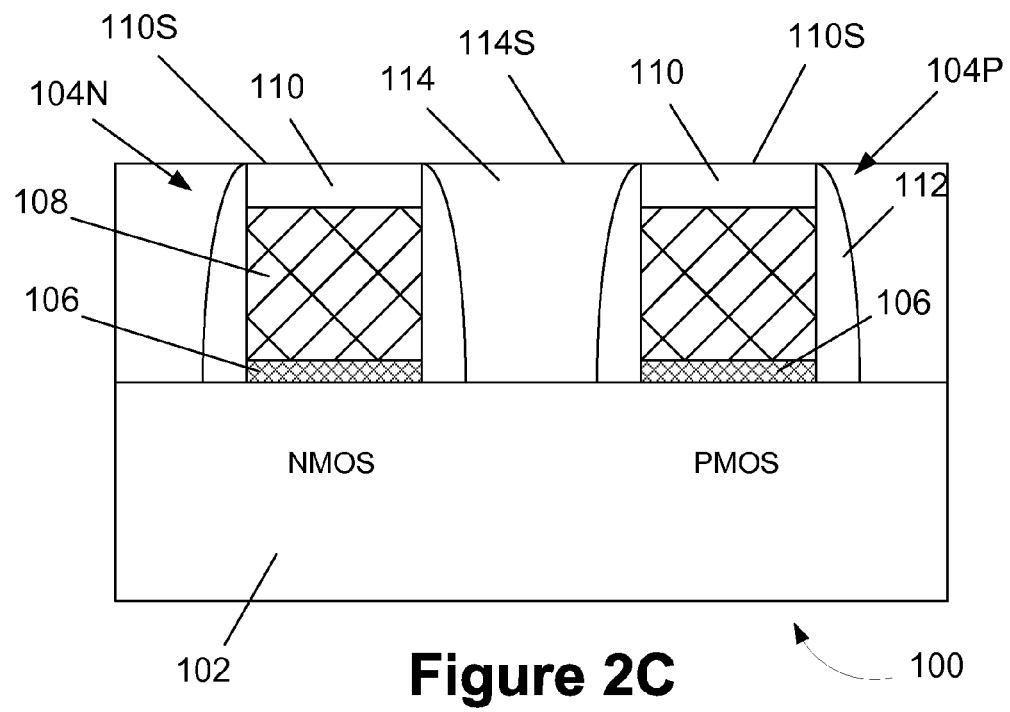

FIG. 2C depicts the product 100 after a planarization process has been performed on the layer of insulating material 114 such that the upper surface 114S of the layer of insulating material 114 is substantially even with the upper surface 110S of the gate cap layers 110. Importantly, this planarization process exposes the upper surface 110S of the gate cap layers 110 such that they can be removed. In one illustrative embodiment, the planarization process may be a chemical mechanical planarization (CMP) process that stops on the gate cap layers 110, or it may be a timed etch-back process that removes the layer of insulating material 114 selectively relative to the gate cap layers 110.

Figure 2D:
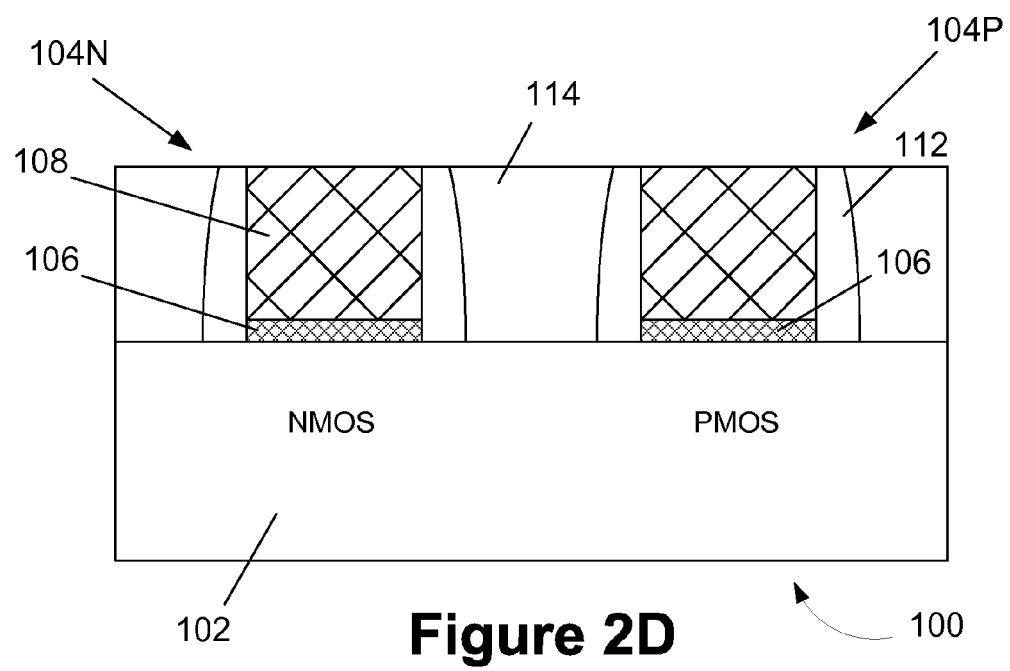

FIG. 2D depicts the product 100 after one or more additional planarization processes have been performed to remove the gate cap layers 110 and expose the sacrificial gate electrodes 108. In one example, the structure depicted in FIG. 2D may be achieved by initially performing a dry etching process to remove the gate cap layers 110 selectively relative to the sacrificial gate electrode 108, followed by performing another CMP process that stops on the now-exposed sacrificial gate electrode 108. Those skilled in the art will recognize that there are other processing sequences that can be performed so as to result in the structure depicted in FIG. 2D. Whatever particular processing sequence is selected, the sacrificial gate electrodes 108 are exposed and ready to be removed.

Figure 2E:
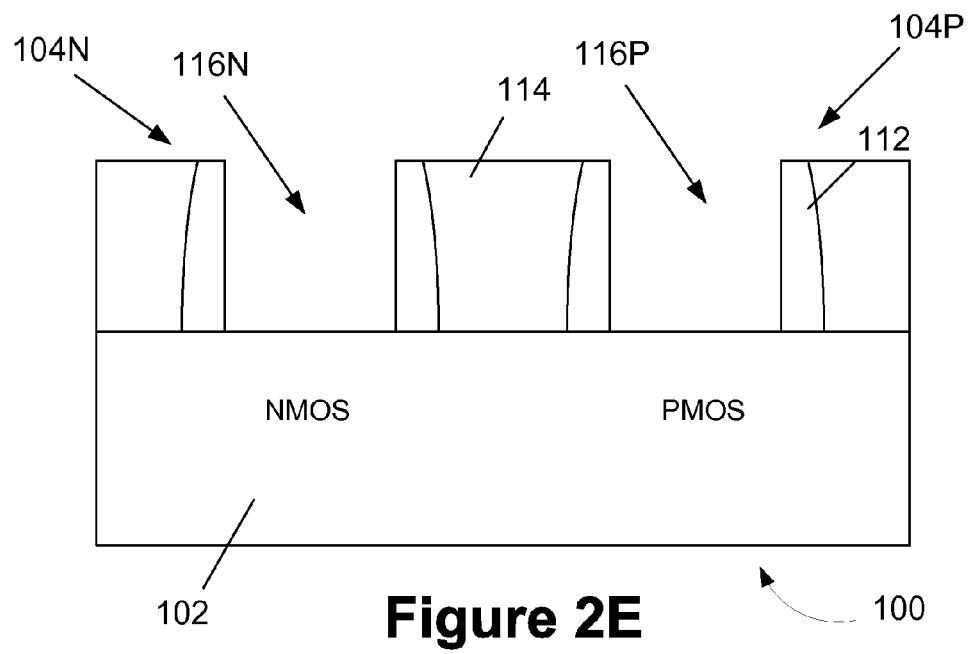

Next, as shown in FIG. 2E, one or more wet or dry etching processes are performed to remove the sacrificial gate electrodes 108 and the sacrificial gate insulation layers 106 to thereby define gate cavities 116N, 116P where a replacement gate structure will subsequently be formed for the transistors 104N, 104P, respectively. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavities 116N, 116P.

Figure 2F:
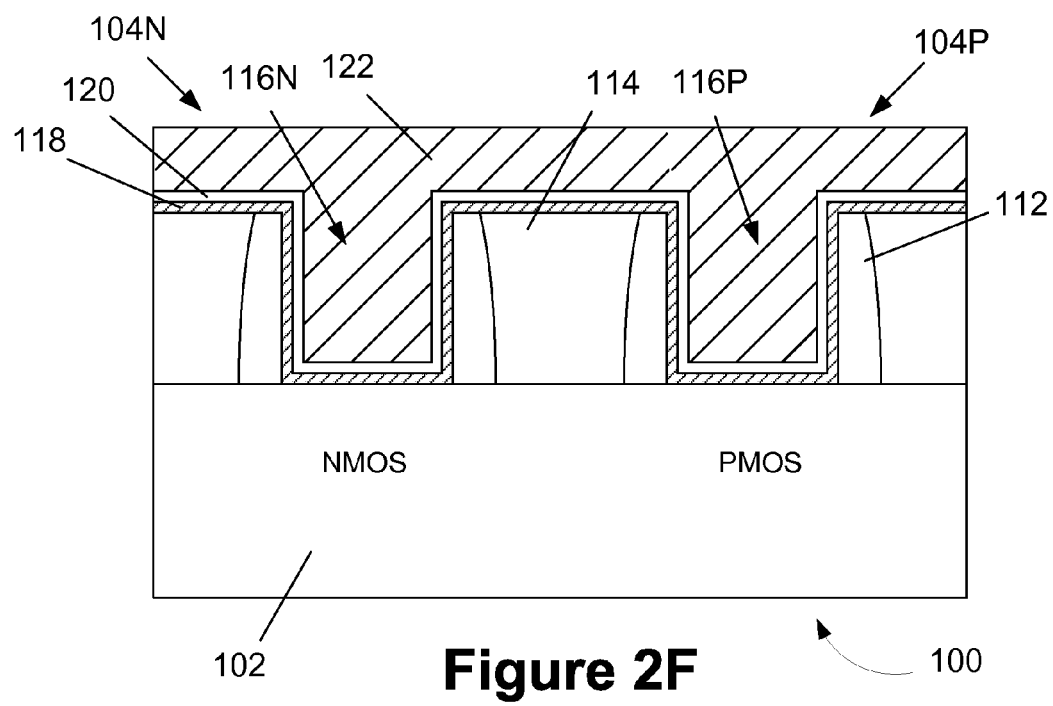

FIG. 2F depicts the product after several process operations were performed. First, a pre-clean process was performed in an attempt to remove all foreign materials from within the gate cavities 116N, 116P prior to forming the various layers of material that will become part of the replacement gate structures. Thereafter, a high-k (k value greater than 10) gate insulation layer 118, such as hafnium oxide, having a thickness of approximately 2 nm was initially deposited in the gate cavities 116N, 116P by performing an ALD process. Then, a sacrificial metal layer 120 (e.g., a layer of titanium nitride with a thickness of about 1-2 nm) was formed on the high-k gate insulation layer 118 and within both of the gate cavities 116N, 116P. In one example, the sacrificial metal layer 120 may be formed by performing an ALD process. The sacrificial metal layer 120 is comprised of a metal that will be used in an anneal process that will be performed to increase the reliability of the high-k gate insulation layer 118, as described more fully below. Thereafter, a sacrificial silicon-containing material layer 122, such as polysilicon or amorphous silicon, is blanket-deposited on the product 100 so as to over-fill the gate cavities 116N, 116P. The sacrificial silicon-containing material layer 122 may be formed by performing, for example, a CVD process. After the sacrificial silicon-containing material layer 122 is formed, an anneal process may be performed to increase the reliability of the high-k gate insulation layer 118. The parameters of such a so-called reliability anneal process are well known to those skilled in the art.

Figure 2G:
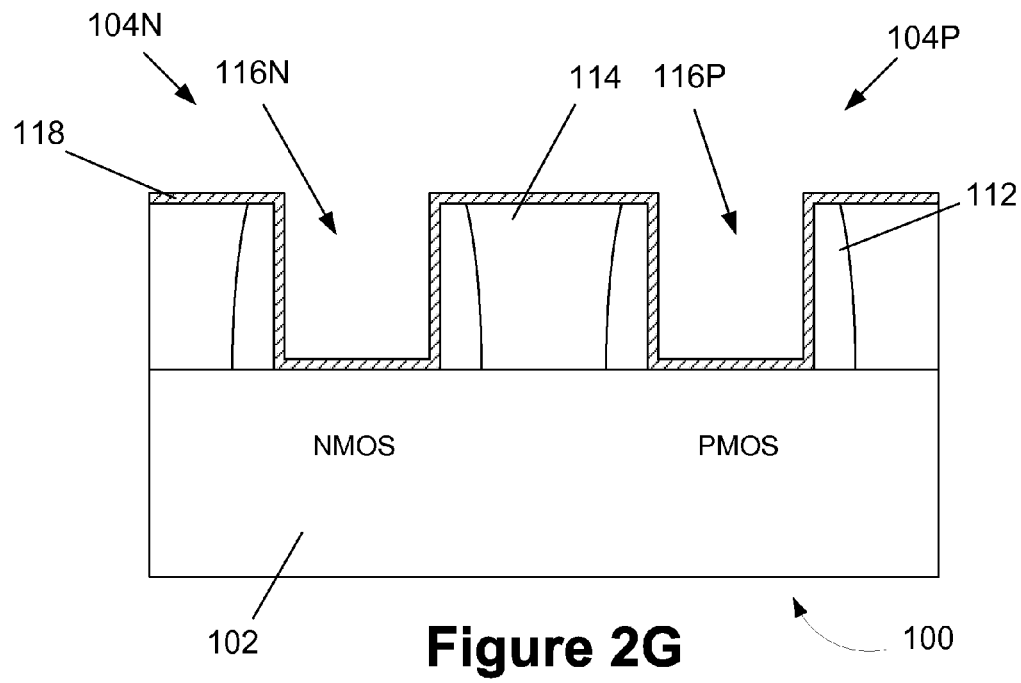

FIG. 2G depicts the product 100 after several process operations were performed. More specifically, after the reliability anneal process was performed, one or more etching processes were performed to remove the sacrificial silicon-containing material layer 122 and the sacrificial metal layer 120 while leaving the high-k gate insulation layer 118 positioned within both of the gate cavities 116N, 116P.

Figure 2H:
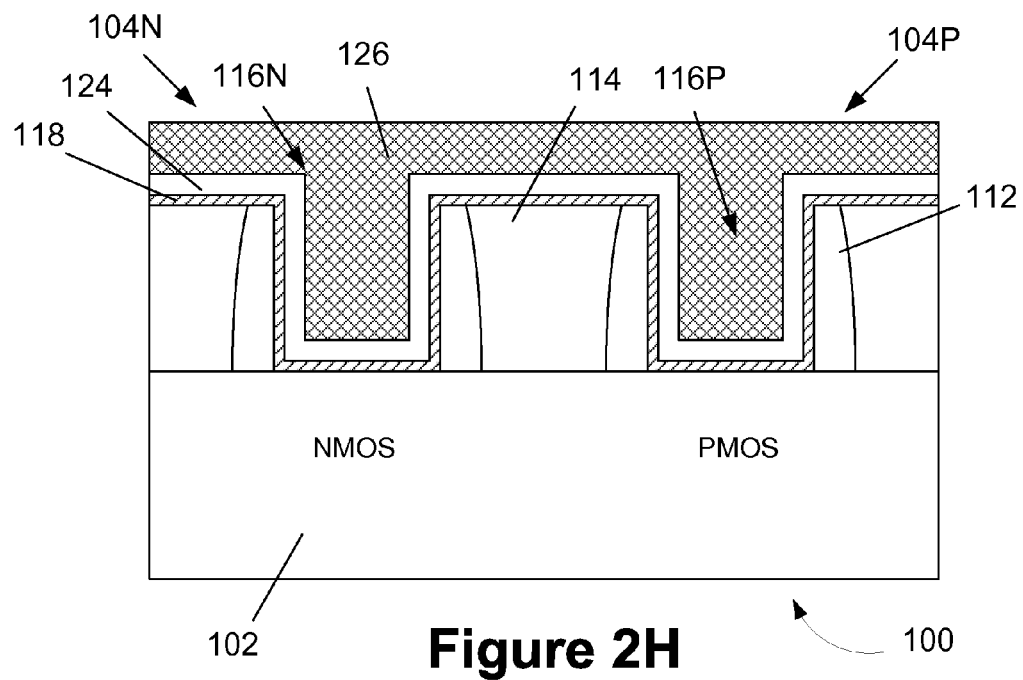

FIG. 2H depicts the product 100 after several process operations were performed. First, a first metal layer 124 (e.g., a layer of titanium nitride with a thickness of about 4 nm) was formed on the gate insulation layer 118 within both of the gate cavities 116N, 116P. The first metal layer 124 is comprised of a metal that will serve as the work function adjusting metal for the PMOS transistor 104P. In general, the first metal layer 124 should be thin enough such that it does not pinch-off the gate cavities. In one example, the first metal layer 124 may be formed by performing an ALD process. Then, a sacrificial material layer 126 is formed so as to over-fill the gate cavities 116N, 116P. In one illustrative embodiment, the sacrificial material layer 126 may be a layer of OPL material that may be formed by performing a spin-coating process. The sacrificial material layer 126 may be formed to any desired thickness.

Figure 2I:
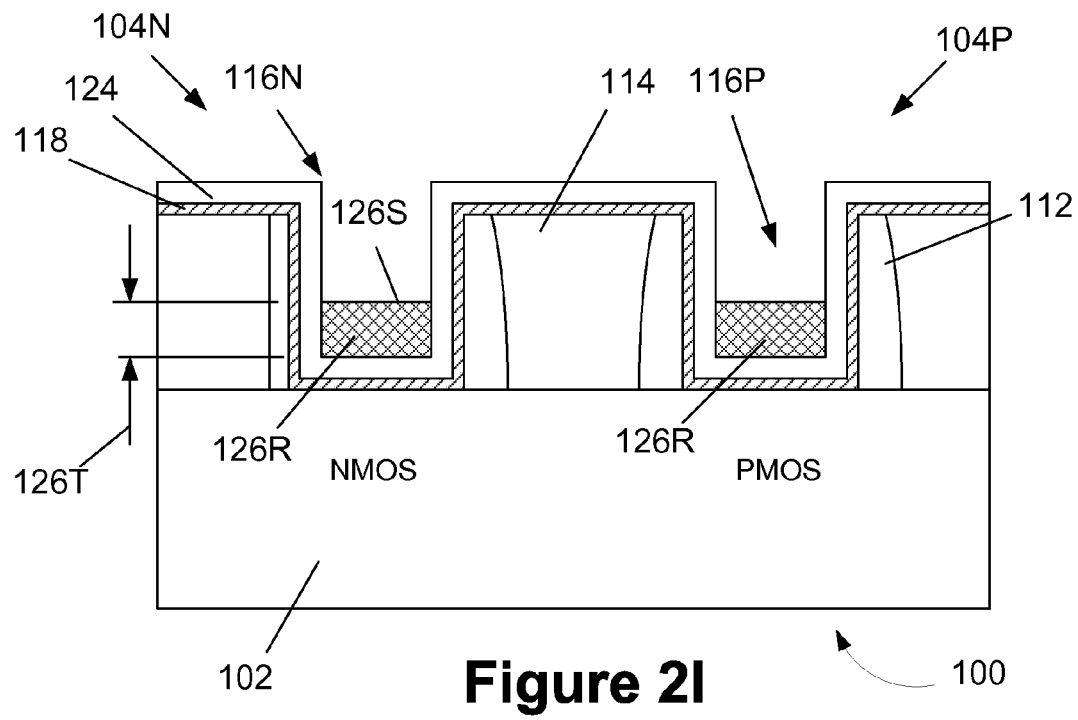

FIG. 2I depicts the product 100 after a dry or wet etching process was performed on the sacrificial material layer 126 to thereby produce a recessed sacrificial material layer 126R having a recessed upper surface 126S. This recessing process leaves the recessed sacrificial material layer 126R positioned only in the gate cavities 116N, 116P. In one illustrative example, the recessing process is performed in such a manner that the thickness 126T of the recessed sacrificial material layer 126R remaining in the gate cavities 116N, 116P is about 10-20 nm.

Figure 2J:
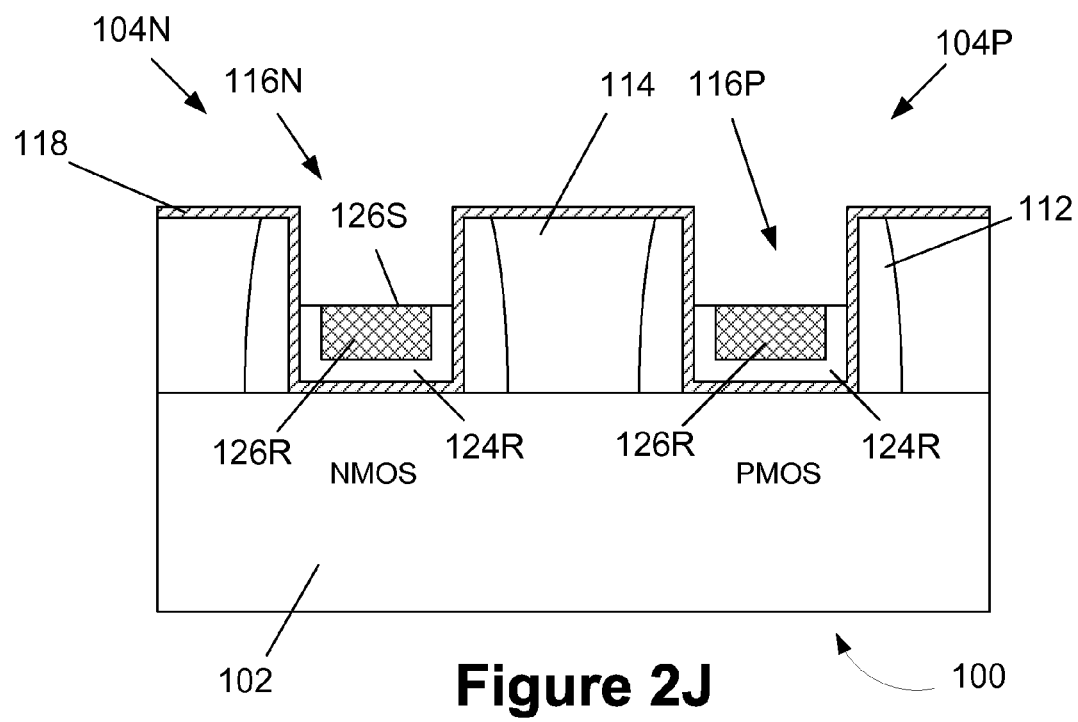

FIG. 2J depicts the product 100 after one or more timed etching processes, e.g., timed dry or wet etching processes, were performed to remove portions of the first metal layer 124 positioned on the sidewalls within the gate cavities 116N, 116P, while leaving the gate insulation layer 118 positioned within both of the gate cavities 116N, 116P. This process results in the definition of recessed first metal layers 124R.

Figure 2K:
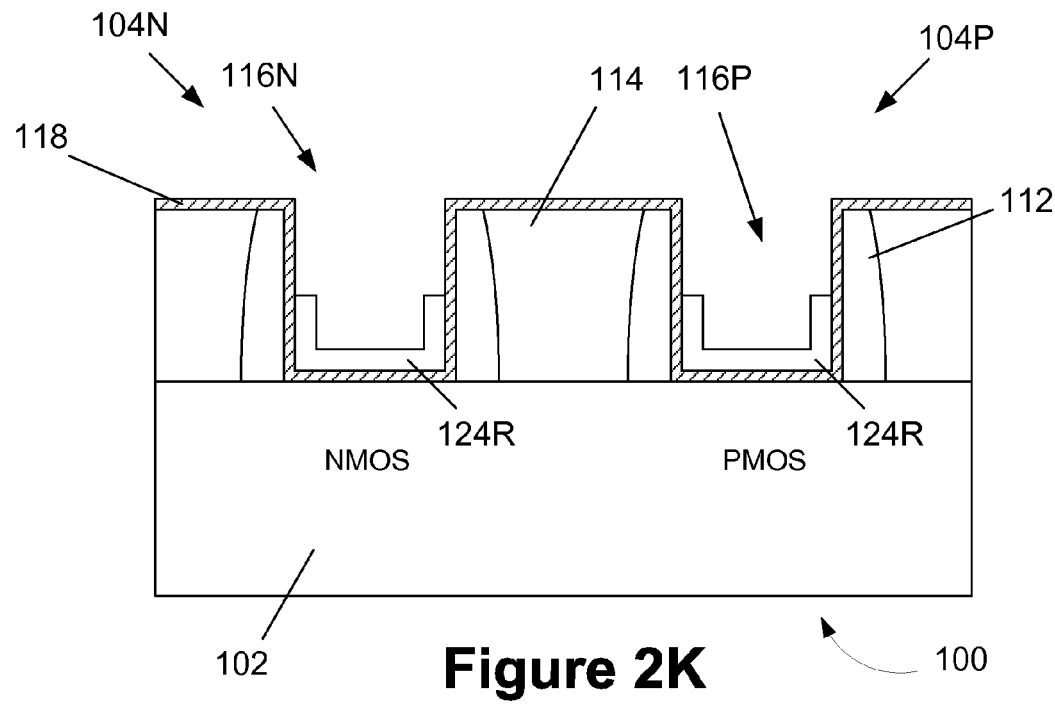

FIG. 2K depicts the product 100 after a dry or wet etching process or a solvent-based process was performed to remove the recessed sacrificial material layer 126R from within both of the gate cavities 116N, 116P.

Figure 2L:
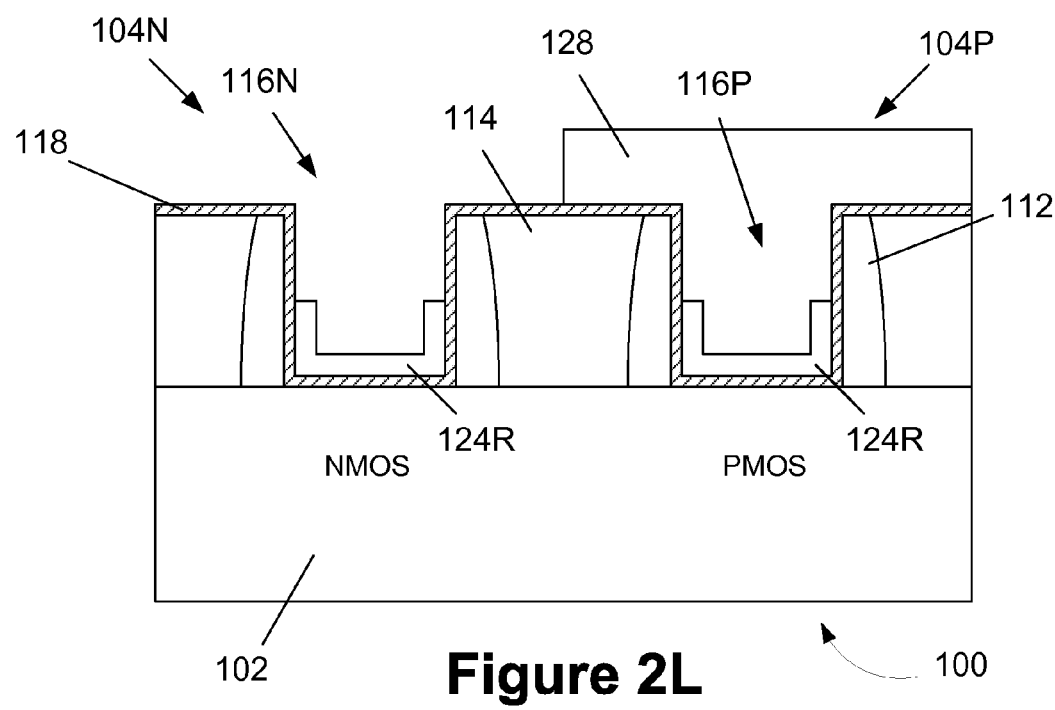

FIG. 2L depicts the product 100 after a patterned masking layer 128 is formed above the product 100. The patterned masking layer 128 covers the PMOS region while leaving the NMOS region exposed for further processing. In one embodiment, the patterned masking layer 128 may be a patterned layer of photoresist material that may be formed using known photolithography tools and techniques.

Figure 2M:
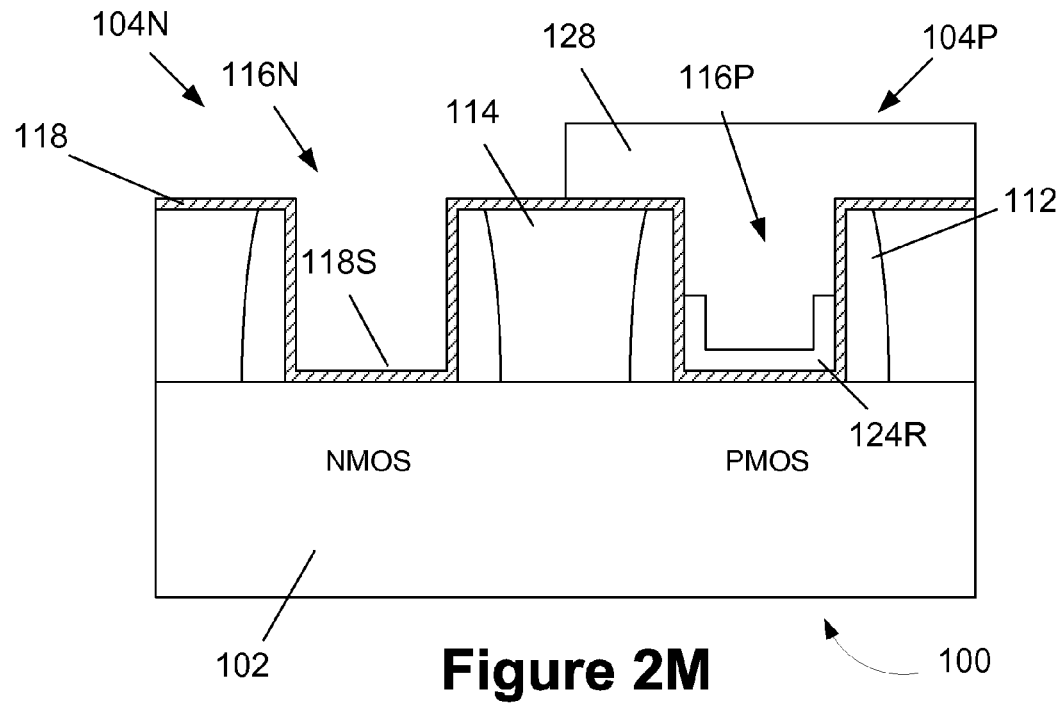

FIG. 2M depicts the product 100 after a dry or wet etching process was performed to remove the recessed first metal layer 124R from the gate cavity 116N for the NMOS transistor 104N. As a result of this etching process, the remaining recessed first metal layer 124R is positioned only in the gate cavity 116P for the PMOS transistor 104P.

Figure 2N:
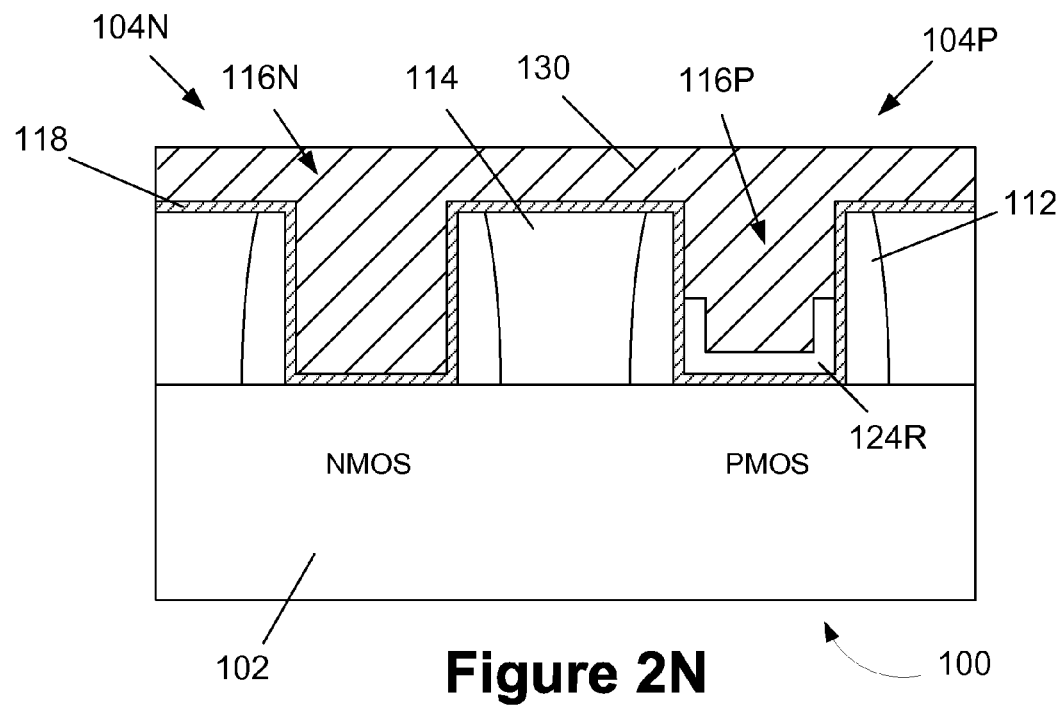

FIG. 2N depicts the product 100 after several process operations were performed. First, the patterned masking layer 128 was removed. Then, a silicon-containing material layer 130, such as polysilicon or amorphous silicon, was blanket-deposited on the product 100 so as to over-fill the gate cavities 116N, 116P. The silicon-containing material layer 130 may be formed by performing, for example, a CVD process and it may be formed to any desired thickness. Although not depicted in the attached drawings, if desired, a thin (e.g., 1 nm TiN) barrier layer (not shown) may be formed on the structure depicted in FIG. 2M (with the masking layer removed) prior to forming the silicon-containing material layer 130.

Figure 2O:
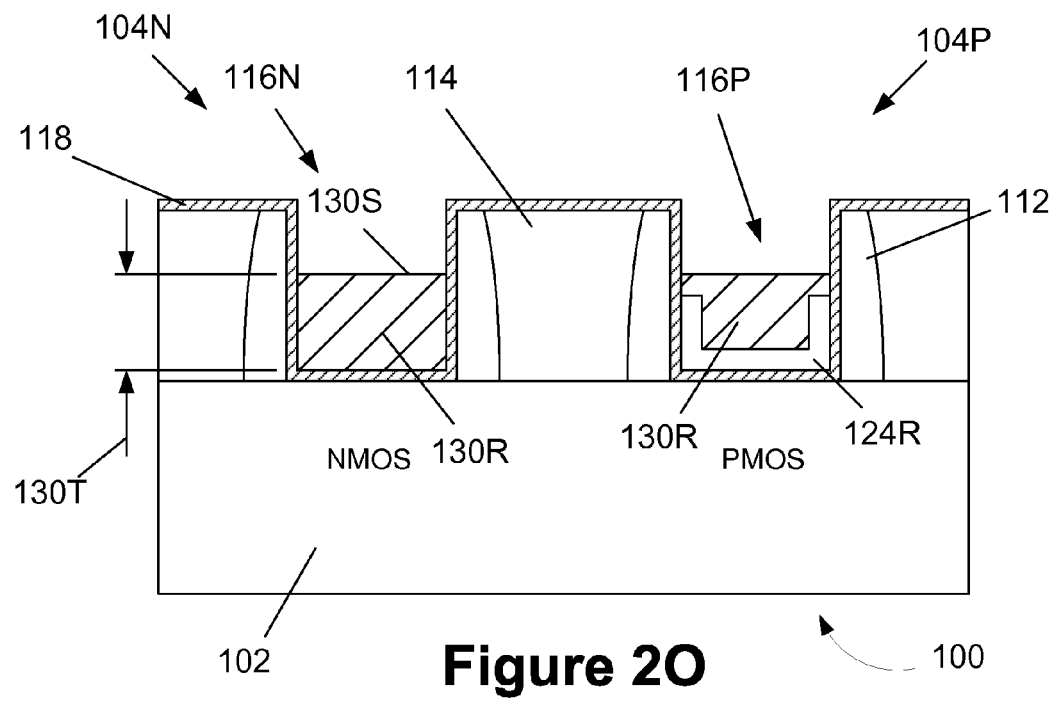

FIG. 2O depicts the product 100 after a dry or wet etching process was performed on the silicon-containing material layer 130 to thereby produce a recessed silicon-containing material layer 130R having a recessed upper surface 130S. This recessing process leaves the recessed silicon-containing material layer 130R positioned only in the gate cavities 116N, 116P. In one illustrative example, the recessing process is performed in such a manner that the thickness 130T of the recessed silicon-containing material layer 130R remaining in the gate cavities 116N, 116P is about 20-40 nm. Note that the portion of the recessed silicon-containing material layer 130R positioned within the PMOS gate cavity 116P has a generally T-shaped cross-sectional configuration, while the portion of the recessed silicon-containing material layer 130R positioned within the NMOS gate cavity 116N has a generally rectangular-shaped cross-sectional configuration.

Figure 2P:
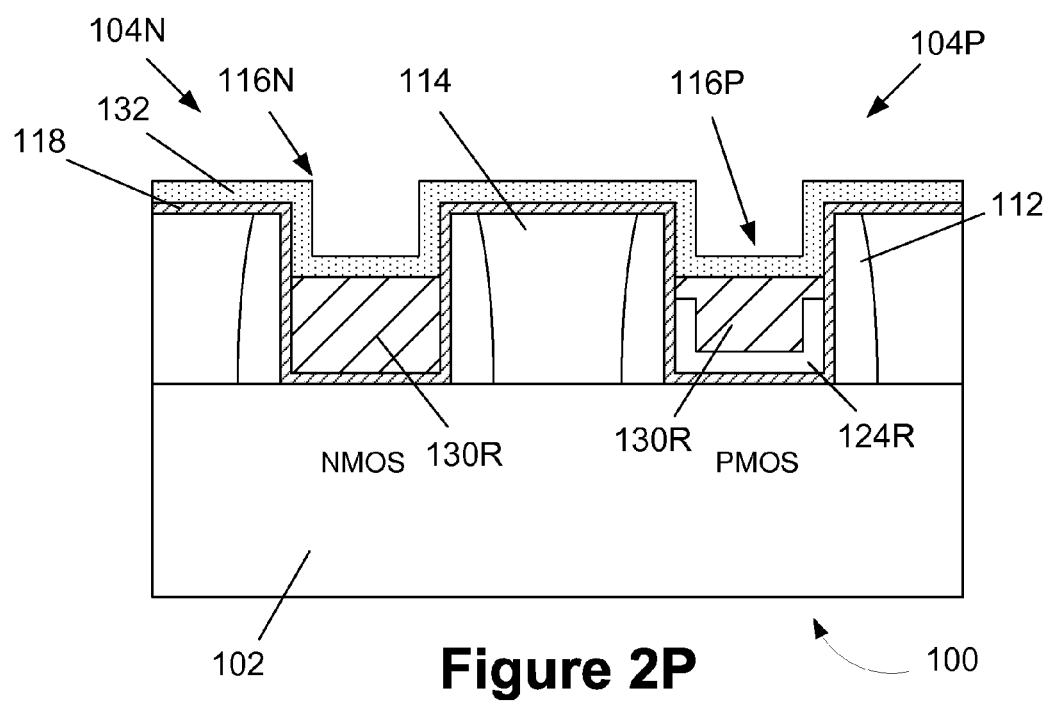

FIG. 2P depicts the product 100 after a second metal layer 132 was deposited on the product 100. In the depicted embodiment, the second metal layer 132 was formed by a conformal deposition process. In other applications, the second metal layer 132 may be formed by performing a blanket deposition process so as to over-fill the gate cavities 116N, 116P. The second metal layer 132 may be comprised of a variety of materials, e.g., tungsten, a transition metal, a refractory metal, etc., and it may be formed by performing, for example, a CVD or PVD process. The second metal layer 132 may be formed to any desired thickness.

Figure 2Q:
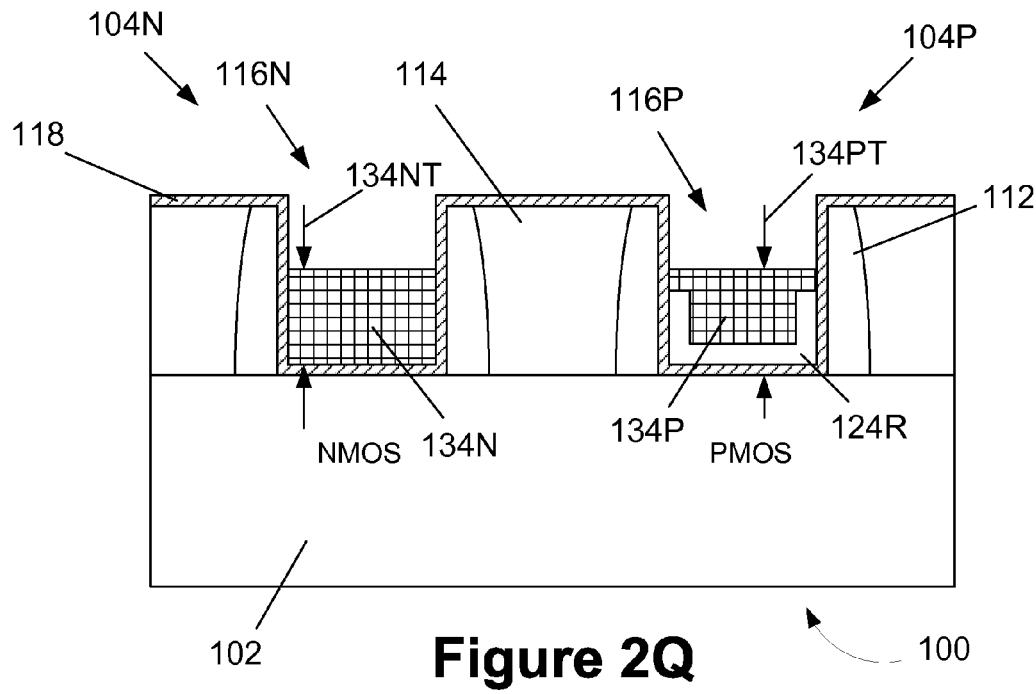

FIG. 2Q depicts the product 100 after several process operations were performed. First, a silicidation process was performed to form metal silicide materials 134N, 134P in the gate cavities 116N, 116P for the transistors 104N, 104P, respectively. The processes and techniques in performing such a silicidation process are well known to those skilled in the art. In one illustrative embodiment, the metal silicide material 134N may have a thickness 134NT (in the vertical direction) of about 20-40 nm and the metal silicide material 134P may have a thickness 134PT (in the vertical direction) of about 20-40 nm, based upon current day technology. Thereafter, in one embodiment, any unreacted residual portions of the second metal layer 132 were removed by performing any of a variety of etching processes. Note that the metal silicide material 134P positioned within the PMOS gate cavity 116P has a generally T-shaped cross-sectional configuration, while the metal silicide material 134N positioned within the NMOS gate cavity 116N has a generally rectangular-shaped cross-sectional configuration.

Figure 2R:
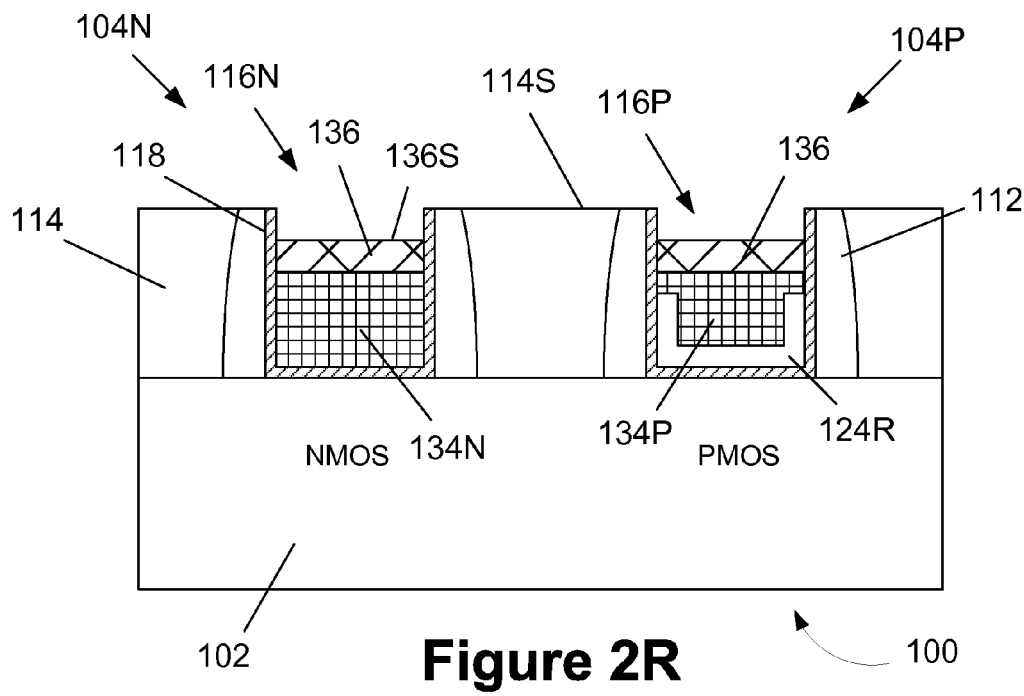

FIG. 2R depicts the product 100 after several process operations were performed. A conductive material layer 136 was blanket-deposited on the product 100 so as to over-fill the gate cavities 116N, 116P. The conductive material layer 136 may be comprised of a variety of different conductive materials, e.g., a metal, a metal alloy, polysilicon, tungsten, aluminum, cobalt, etc., and it may be formed by performing, for example, a CVD or a PVD process. The conductive material layer 136 may be formed to any desired thickness. Thereafter, a planarization processes was performed to remove the portions of the conductive material layer 136 and the gate insulation layer 118 that are positioned above the surface 114S of the layer of insulating material 114 and outside of the gate cavities 116N, 116P. Then, a dry or wet etching process was performed on the conductive material layer 136 to thereby produce a conductive material layer 136 having a recessed upper surface 136S. In one embodiment, the recessing process may be a timed etching process. The structure depicted in FIG. 2R may be achieved by performing one or more CMP and or etching processes in any of a variety of different processing sequences.

Figure 2S:
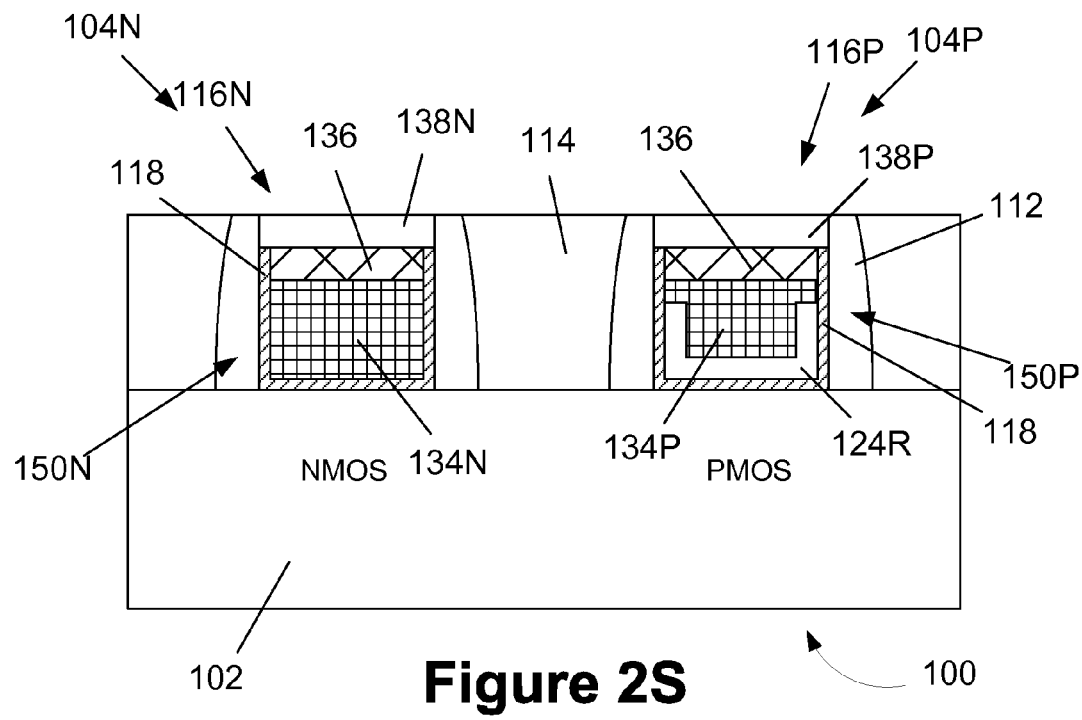

FIG. 2S depicts the product 100 after several process operations were performed. First, one or more dry or wet etching processes were performed to remove portions of the gate insulation layer 118 positioned on the sidewalls within the gate cavities 116N, 116P above the conductive material layer 136. Then, a layer of gate cap material, e.g. silicon nitride, was blanket-deposited above the product 100 and a planarization process was performed on the layer of gate cap material to thereby define gate cap layer 138N, 138P for the transistors 104N, 104P, respectively. In one illustrative embodiment, the planarization process may be a chemical mechanical planarization (CMP) process that stops on the layer of insulating material 114.

At this point in the process flow, the final gate structures 150N, 150P have been formed for the transistors 104N, 104P, respectively. The gate cap layers 138N, 138P have also been formed to protect the gate structures 150N, 150P. In the illustrative methods disclosed herein, formation of the final gate structure 150N only requires performing one conformal metal deposition process, which leaves significantly more room within the gate cavity 116N to form the needed metal materials within the gate cavity 116N. In the depicted example, this is achieved by forming the metal silicide material 134N. More importantly, the methodologies disclosed herein are equally compatible with forming replacement gate structures for PMOS devices, as shown above. Thus, the method disclosed herein have significant value as it relates to forming integrated circuit products using CMOS technology. Other benefits will be apparent to those skilled in the art after a complete reading of the present application. At the point of fabrication depicted in FIG. 2S, the integrated circuit product 100 may be completed by performing several traditional manufacturing processes, e.g., the formation of contacts to the source/drain regions of the device, the formation of various metallization layers for the product, etc.

It should also be noted that, in one particular embodiment, if the second metal layer 132 (see FIG. 2P) is made of tungsten, and it is formed to a thickness such that it over-fills the gate cavities 116N, 116P, then the stripping of the unreacted portions of the second metal layer 132 (as depicted in FIG. 2Q) may not be required. That is, in such an embodiment, the above-described CMP and etching processes may be performed after the silicidation process is completed without the need of removing unreacted portions of the second metal layer 132 when it is made of tungsten. Such an embodiment would also not require formation of the above-described conductive material layer 136.

One illustrative method disclosed herein includes forming replacement gate structures 150N, 150P for an NMOS transistor 104N and a PMOS transistor 104P by performing at least one etching process to remove the sacrificial gate structures 103 for the NMOS and PMOS transistors to thereby define NMOS and PMOS gate cavities 116N, 116P, respectively, depositing a gate insulation layer 118 in the NMOS and PMOS gate cavities 116N, 116P, depositing a first metal layer 124 on the gate insulation layers 118 in the NMOS and PMOS gate cavities 116N, 116P, performing at least one first process operation to form a first metal layer 124R in both the NMOS gate cavity 116N and the PMOS gate cavity 116P and thereafter remove the first metal layer 124R within the NMOS gate cavity 116N while leaving a remaining portion of the first metal layer 124R positioned on the gate insulation layer 118 in the PMOS gate cavity 116P, performing at least one second process operation to form first and second metal silicide regions 134N, 134P within the NMOS gate cavity 116N and the PMOS gate cavity 116P, respectively, wherein the first metal silicide region 134N is positioned above the gate insulation layer 118 in the NMOS gate cavity 116N and the second metal silicide region 134P is positioned above at least the remaining portion of the first metal layer 124R within the PMOS gate cavity 116P, and forming first and second gate cap layers 138N, 138P within the NMOS and PMOS gate cavities 116N, 116P, respectively, above the first and second metal silicide regions 134N, 134P, respectively.

Another illustrative method disclosed herein includes forming replacement gate structures for an NMOS transistor 104N and a PMOS transistor 104P by performing at least one etching process to remove the sacrificial gate structures 103 for the NMOS and PMOS transistors to thereby define NMOS and PMOS gate cavities 116N, 116P, respectively, depositing a gate insulation layer 118 in the NMOS and PMOS gate cavities 116N, 116P, depositing a first metal layer 124 on the gate insulation layers 118 in the NMOS and PMOS gate cavities 116N, 116P, performing at least one first process operation to selectively remove the first metal layer 124R from within the NMOS gate cavity 116N while leaving a remaining portion of the first metal layer 124R positioned on the gate insulation layer 118 in the PMOS gate cavity 116P, performing at least one second process operation to form a first portion 130R of a silicon-containing material within the NMOS cavity 116N above the gate insulation layer 118 and a second portion 130R of the silicon-containing material within the PMOS cavity 116P above the remaining portion of the first metal layer 124R, forming a layer of tungsten 132 (or 136) on the first and second portions of the silicon-containing material and converting at least a portion of the first and second silicon-containing materials into first and second tungsten silicide regions 134N, 134P while leaving a portion of the layer of tungsten above the first and second silicide regions, wherein the first tungsten silicide region 134N is formed within the NMOS gate cavity 116N above the gate insulation layer 118 and the second tungsten silicide region 134P is formed within the PMOS gate cavity 116P above at least the remaining portion of the first metal layer 124R.

One example of a novel integrated circuit product 100 disclosed herein includes an NMOS transistor 104N having a gate structure comprised of an NMOS gate insulation layer 118 comprised of a high-k gate insulation material, an NMOS metal silicide region 134N positioned above the NMOS gate insulation layer 118, wherein the NMOS metal silicide region 134N has a generally rectangular cross-sectional configuration, and an NMOS metal layer 138 (or 136) positioned on the NMOS metal silicide region 134N. The integrated circuit product 100 further includes a PMOS transistor 104P having a gate structure comprised of a PMOS gate insulation layer 118 comprised of the high-k gate insulation material, a first PMOS metal layer 124R positioned on the PMOS gate insulation layer 118, a PMOS metal silicide region 134P positioned above the first PMOS metal layer 124R, wherein the PMOS metal silicide region 134P has a generally T-shaped cross-sectional configuration and wherein the PMOS metal silicide region 134P and the NMOS metal silicide region 134N are comprised of the same metal silicide, and a second PMOS metal layer 132 (or 136) positioned on the PMOS metal silicide region 134P, wherein the NMOS metal layer 132 (or 136) and the second PMOS metal layer 132 (or 136) are comprised of the same material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming replacement gate structures for an NMOS transistor and a PMOS transistor, comprising:
    performing at least one etching process to remove a sacrificial gate structure for said NMOS transistor and a sacrificial gate structure for said PMOS transistor to thereby define an NMOS gate cavity and a PMOS gate cavity;
    depositing a gate insulation layer in said NMOS gate cavity and in said PMOS gate cavity;
    performing at least one first process operation so as to form a first metal layer on said gate insulation layer in both said NMOS gate cavity and said PMOS gate cavity and thereafter remove said first metal layer within said NMOS gate cavity while leaving a remaining portion of said first metal layer positioned on said gate insulation layer in said PMOS gate cavity;
    performing at least one second process operation to form first and second metal silicide regions within said NMOS gate cavity and said PMOS gate cavity, respectively, wherein said first metal silicide region is positioned above said gate insulation layer in said NMOS gate cavity and said second metal silicide region is positioned above at least said remaining portion of said first metal layer within said PMOS gate cavity;
    forming a second metal layer on said first and second metal silicide regions; and
    forming first and second gate cap layers within said NMOS and PMOS gate cavities, respectively, above said first and second metal silicide regions, respectively, such that they contact said second metal layer.

2. The method of claim 1, wherein said first metal silicide region is formed so as to have a substantially rectangular cross-sectional configuration and said second metal silicide region is formed so as to have a substantially T-shaped cross-sectional configuration.

3. The method of claim 1, wherein said first and second metal silicide regions are a metal silicide of a refractory metal or a transition metal.

4. The method of claim 1, wherein said first and second metal silicide regions are comprised of tungsten silicide.

5. The method of claim 1, wherein said gate insulation layer is a layer of high-k insulating material.

6. The method of claim 1, wherein performing said at least one first process operation comprises:
    depositing said first metal layer on said gate insulation layer in said NMOS gate cavity and in said PMOS gate cavity;
    forming a sacrificial material layer above said first metal layer within both of said NMOS and PMOS cavities;
    recessing said sacrificial material layer;
    removing portions of said first metal layer exposed by said recessed sacrificial material layer to thereby result in a first portion of said first metal layer being positioned within said NMOS gate cavity and said remaining portion of said first metal layer being positioned in said PMOS gate cavity;
    removing said recessed sacrificial material layer from within both of said NMOS and PMOS cavities;
    forming a masking layer that covers said PMOS gate cavity but leaves said NMOS gate cavity exposed; and
    with said masking layer in place, removing said first portion of said first metal layer from within said NMOS gate cavity.

7. The method of claim 6, wherein performing said at least one second process operation comprises:
    forming a first portion of a silicon-containing material layer on said gate insulation layer within said NMOS gate cavity and a second portion of said silicon-containing material on said remaining portion of said first metal layer within said PMOS gate cavity;
    depositing a second metal layer on said first and second portions of said silicon-containing material layer; and
    converting at least portions of said first and second portions of said silicon-containing material into said first and second metal silicide regions, respectively.

8. The method of claim 1, wherein said first metal silicide region is formed such that it contacts said gate insulation layer in said NMOS gate cavity and said second metal silicide region is formed such that it contacts said remaining portion of said first metal layer within said PMOS gate cavity.

9. A method of forming replacement gate structures for an NMOS transistor and a PMOS transistor, comprising:
    performing at least one etching process to remove a sacrificial gate structure for said NMOS transistor and a sacrificial gate structure for said PMOS transistor to thereby define an NMOS gate cavity and a PMOS gate cavity;
    depositing a high-k gate insulation layer in said NMOS gate cavity and in said PMOS gate cavity;
    depositing a first metal layer on said high-k gate insulation layer in both said NMOS gate cavity and said PMOS gate cavity;
    performing at least one first process operation to selectively remove said first metal layer from within said NMOS gate cavity while leaving a remaining portion of said first metal layer positioned on said high-k gate insulation layer in said PMOS gate cavity;
    performing at least one second process operation to form a first portion of a silicon-containing material within said NMOS cavity above said high-k gate insulation layer and a second portion of said silicon-containing material within said PMOS cavity above said remaining portion of said first metal layer;
    forming a layer of tungsten on said first and second portions of said silicon-containing material; and
    converting at least a portion of said first and second silicon-containing materials into first and second tungsten silicide regions while leaving a portion of said layer of tungsten above said first and second silicide regions, wherein said first tungsten silicide region is formed within said NMOS gate cavity above said high-k gate insulation layer and said second tungsten silicide region is formed within said PMOS gate cavity above at least said remaining portion of said first metal layer.

10. The method of claim 9, further comprising forming gate cap layers within said NMOS and PMOS gate cavities on said layer of tungsten.

11. The method of claim 9, wherein said first metal silicide region is formed such that it contacts said high-k gate insulation layer in said NMOS gate cavity and said second metal silicide region is formed such that it contacts said remaining portion of said first metal layer within said PMOS gate cavity.

12. The method of claim 9, wherein said first metal silicide region is formed so as to have a substantially rectangular cross-sectional configuration and said second metal silicide region is formed so as to have a substantially T-shaped cross-sectional configuration.

13. The method of claim 9, wherein said first metal layer is comprised of titanium nitride.

14. A method of forming replacement gate structures for an NMOS transistor and a PMOS transistor, comprising:
performing at least one etching process to remove a sacrificial gate structure for said NMOS transistor and a sacrificial gate structure for said PMOS transistor to thereby define an NMOS gate cavity and a PMOS gate cavity;
depositing a high-k gate insulation layer in said NMOS gate cavity and in said PMOS gate cavity;
depositing a first metal layer on said high-k gate insulation layer in said NMOS gate cavity and in said PMOS gate cavity;
performing at least one first process operation to selectively remove said first metal layer from within said NMOS gate cavity while leaving a remaining portion of said first metal layer positioned on said high-k gate insulation layer in said PMOS gate cavity;
performing at least one second process operation to form a first portion of a silicon-containing material within said NMOS cavity on said high-k gate insulation layer and a second portion of said silicon-containing material within said PMOS cavity on said remaining portion of said first metal layer;
forming a layer of tungsten on said first and second portions of said silicon-containing material; and
converting at least a portion of said first and second silicon-containing materials into first and second tungsten silicide regions while leaving a portion of said layer of tungsten above said first and second silicide regions, wherein said first tungsten silicide region is formed within said NMOS gate cavity and on said high-k gate insulation layer and said second tungsten silicide region is formed within said PMOS gate cavity and on at least said remaining portion of said first metal layer; and
forming gate cap layers within said NMOS and PMOS gate cavities on said layer of tungsten.

15. The method of claim 14, wherein said first tungsten silicide region is formed so as to have a substantially rectangular cross-sectional configuration and said second tungsten silicide region is formed so as to have a substantially T-shaped cross-sectional configuration.

16. A method of forming replacement gate structures for an NMOS transistor and a PMOS transistor, comprising:
performing at least one etching process to remove a sacrificial gate structure for said NMOS transistor and a sacrificial gate structure for said PMOS transistor to thereby define an NMOS gate cavity and a PMOS gate cavity;
depositing a gate insulation layer in said NMOS gate cavity and in said PMOS gate cavity;
performing at least one first process operation so as to form a first metal layer on said gate insulation layer in both said NMOS gate cavity and said PMOS gate cavity and thereafter remove said first metal layer within said NMOS gate cavity while leaving a remaining portion of said first metal layer positioned on said gate insulation layer in said PMOS gate cavity;
performing at least one second process operation to form first and second metal silicide regions within said NMOS gate cavity and said PMOS gate cavity, respectively, wherein said first metal silicide region is positioned above said gate insulation layer in said NMOS gate cavity and said second metal silicide region is positioned above at least said remaining portion of said first metal layer within said PMOS gate cavity, wherein said first metal silicide region is formed so as to have a substantially rectangular cross-sectional configuration and said second metal silicide region is formed so as to have a substantially T-shaped cross-sectional configuration; and
forming first and second gate cap layers within said NMOS and PMOS gate cavities, respectively, above said first and second metal silicide regions, respectively.

17. The method of claim 16, wherein said first and second metal silicide regions are a metal silicide of a refractory metal or a transition metal.

18. The method of claim 16, wherein said first and second metal silicide regions are comprised of tungsten silicide.

19. The method of claim 16, wherein said gate insulation layer is a layer of high-k insulating material.

20. The method of claim 16, wherein performing said at least one first process operation comprises:
depositing said first metal layer on said gate insulation layer in said NMOS gate cavity and in said PMOS gate cavity;
forming a sacrificial material layer above said first metal layer within both of said NMOS and PMOS cavities;
recessing said sacrificial material layer;
removing portions of said first metal layer exposed by said recessed sacrificial material layer to thereby result in a first portion of said first metal layer being positioned within said NMOS gate cavity and said remaining portion of said first metal layer being positioned in said PMOS gate cavity;
removing said recessed sacrificial material layer from within both of said NMOS and PMOS cavities;
forming a masking layer that covers said PMOS gate cavity but leaves said NMOS gate cavity exposed; and
with said masking layer in place, removing said first portion of said first metal layer from within said NMOS gate cavity.

21. The method of claim 20, wherein performing said at least one second process operation comprises:
forming a first portion of a silicon-containing material layer on said gate insulation layer within said NMOS gate cavity and a second portion of said silicon-containing material on said remaining portion of said first metal layer within said PMOS gate cavity;
depositing a second metal layer on said first and second portions of said silicon-containing material layer; and
converting at least portions of said first and second portions of said silicon-containing material into said first and second metal silicide regions, respectively.

22. The method of claim 21, wherein said first metal silicide region is formed such that it contacts said gate insulation layer in said NMOS gate cavity and said second metal silicide region is formed such that it contacts said remaining portion of said first metal layer within said PMOS gate cavity.

23. A method of forming replacement gate structures for an NMOS transistor and a PMOS transistor, comprising:
performing at least one etching process to remove a sacrificial gate structure for said NMOS transistor and a sacrificial gate structure for said PMOS transistor to thereby define an NMOS gate cavity and a PMOS gate cavity;
depositing a gate insulation layer in said NMOS gate cavity and in said PMOS gate cavity;
performing at least one first process operation so as to form a first metal layer on said gate insulation layer in both said NMOS gate cavity and said PMOS gate cavity and thereafter remove said first metal layer within said NMOS gate cavity while leaving a remaining portion of said first metal layer positioned on said gate insulation layer in said PMOS gate cavity;

performing at least one second process operation to form first and second metal silicide regions within said NMOS gate cavity and said PMOS gate cavity, respectively, wherein said first metal silicide region contacts said gate insulation layer in said NMOS gate cavity and said second metal silicide region contacts said remaining portion of said first metal layer within said PMOS gate cavity; and forming first and second gate cap layers within said NMOS and PMOS gate cavities, respectively, above said first and second metal silicide regions, respectively.

24. The method of claim 23, wherein said first and second metal silicide regions are a metal silicide of a refractory metal or a transition metal.

25. The method of claim 23, wherein said first and second metal silicide regions are comprised of tungsten silicide.

26. The method of claim 23, wherein said gate insulation layer is a layer of high-k insulating material.

27. The method of claim 23, wherein performing said at least one first process operation comprises:

depositing said first metal layer on said gate insulation layer in said NMOS gate cavity and in said PMOS gate cavity;

forming a sacrificial material layer above said first metal layer within both of said NMOS and PMOS cavities;

recessing said sacrificial material layer;

removing portions of said first metal layer exposed by said recessed sacrificial material layer to thereby result in a first portion of said first metal layer being positioned within said NMOS gate cavity and said remaining portion of said first metal layer being positioned in said PMOS gate cavity;

removing said recessed sacrificial material layer from within both of said NMOS and PMOS cavities;

forming a masking layer that covers said PMOS gate cavity but leaves said NMOS gate cavity exposed; and with said masking layer in place, removing said first portion of said first metal layer from within said NMOS gate cavity.

28. The method of claim 27, wherein performing said at least one second process operation comprises:

forming a first portion of a silicon-containing material layer on said gate insulation layer within said NMOS gate cavity and a second portion of said silicon-containing material on said remaining portion of said first metal layer within said PMOS gate cavity;

depositing a second metal layer on said first and second portions of said silicon-containing material layer; and converting at least portions of said first and second portions of said silicon-containing material into said first and second metal silicide regions, respectively.

* * * * *